(12) United States Patent
Xu et al.

(10) Patent No.: US 8,895,986 B2
(45) Date of Patent: Nov. 25, 2014

(54) TFT FLAT SENSOR AND MANUFACTURING METHOD THEREFOR

(71) Applicant: Beijing Boe Optoelectronics Technology Co., Ltd., Beijing (CN)

(72) Inventors: Shaoying Xu, Beijing (CN); Zhenyu Xie, Beijing (CN); Xu Chen, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 14/023,606

(22) Filed: Sep. 11, 2013

(65) Prior Publication Data

US 2014/0077282 A1    Mar. 20, 2014

(30) Foreign Application Priority Data

Sep. 19, 2012 (CN) .......................... 2012 1 0350476

(51) Int. Cl.
| | |
|---|---|
| *H01L 29/04* | (2006.01) |
| *H01L 29/10* | (2006.01) |
| *H01L 31/18* | (2006.01) |
| *H01L 31/14* | (2006.01) |
| *H01L 27/12* | (2006.01) |
| *H01L 29/49* | (2006.01) |
| *H01L 29/417* | (2006.01) |
| *H01L 27/146* | (2006.01) |

(52) U.S. Cl.
CPC .............. *H01L 31/18* (2013.01); *H01L 31/145* (2013.01); *H01L 27/12* (2013.01); *H01L 29/4908* (2013.01); *H01L 27/1214* (2013.01); *H01L 29/41733* (2013.01); *H01L 27/14658* (2013.01)
USPC ................................ 257/59; 257/72; 257/350

(58) Field of Classification Search
CPC . H01L 27/1214; H01L 27/12; H01L 29/4908; H01L 29/41733
USPC ................................................ 257/59, 72, 350
See application file for complete search history.

(56) References Cited

U.S. PATENT DOCUMENTS

| | | | |
|---|---|---|---|
| 7,242,449 B1 * | 7/2007 | Yamazaki et al. | 349/116 |
| 8,389,343 B2 * | 3/2013 | Yamazaki | 438/149 |

(Continued)

FOREIGN PATENT DOCUMENTS

| | | |
|---|---|---|
| CN | 102456696 A | 3/2006 |
| CN | 102157533 A | 8/2011 |
| CN | 102654703 A | 9/2012 |

OTHER PUBLICATIONS

First Chinese Office Action dated Aug. 19, 2014; Appln. No. 201210350476.9.

*Primary Examiner* — Ngan Ngo
(74) *Attorney, Agent, or Firm* — Ladas & Parry LLP (57) ABSTRACT

A TFT flat sensor comprises pixel units each comprising: a common electrode and a common electrode insulating layer on a substrate, wherein a first via hole is provided in the common electrode insulating layer at a location corresponding to the common electrode; a gate electrode on the common electrode insulating layer; a first conductive film layer on the common electrode and the gate electrode wherein the first conductive film layer contacts the common electrode through a first via hole; a gate insulating layer, an active layer, a drain electrode and a source electrode, a second conductive film layer, a protection layer and a third conductive film layer on the first conductive film layer; a second via hole is provided in the protection layer at a location corresponding to the source electrode through which the third conductive film layer contacts the source electrode.

6 Claims, 7 Drawing Sheets

(56) References Cited

U.S. PATENT DOCUMENTS

| | | | |
|---|---|---|---|
| 2005/0258425 A1* | 11/2005 | Izumi | 257/72 |
| 2006/0035064 A1* | 2/2006 | Hirai | 428/195.1 |
| 2012/0097940 A1 | 4/2012 | Kwon et al. | |
| 2013/0161656 A1* | 6/2013 | Choi et al. | 257/88 |
| 2014/0131714 A1 | 5/2014 | Bai et al. | |

* cited by examiner

TFT FLAT SENSOR AND MANUFACTURING METHOD THEREFOR

BACKGROUND

Embodiments of the present disclosure relate to a thin film transistor (TFT) flat sensor and a method for manufacturing the same.

TFT flat X-ray sensors are key elements in digital image technology with advantages such as fast imaging speed, good spatial and density resolution, high ratio of signal-to-noise, direct digital signal output, and are widely applied in medical imaging (such as X-ray chest test), industrial detection (such as metal defect detection), safety detection and air transport.

Figure 1:
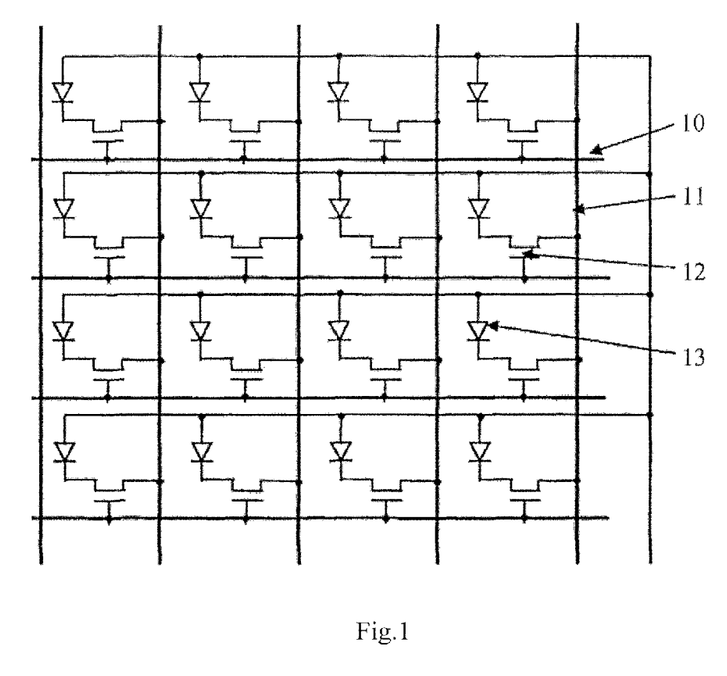
FIG. 1 is a structural view of a traditional array substrate of TFT flat sensors.

A traditional array substrate of TFT flat sensors has a structure as illustrated in FIG. 1. The array substrate comprises a plurality of gate scanning lines 10 and a plurality of data scanning lines 11 intersecting each other and a plurality of pixel units defined by the gate scanning lines 10 and the data scanning lines 11. Each pixel unit comprises one field effect transistor (FET) 12 connected with one adjacent gate scanning line 10 and one photodiode 13 connected with the data scanning line 11 via the field effect tube 12 connected to the photodiode 13.

When there is for example X-ray irradiation, the TFT flat sensor senses optoelectronic signals generated by the X-ray through the photodiodes, applies scanning signals to all the pixel units via the gate scanning lines to control On/Off state of the FETs, thereby indirectly controlling data acquisition circuit's reading function for optoelectronic signals generated by all the photodiodes. When an FET is turned on, optoelectronic signals generated by a photodiode corresponding to the FET can be connected to a data scanning line at the output end of the photodiode for acquisition, thus acquisition of photodiode's optoelectronic signals may be implemented by controlling the time sequence of driving signals for gate scanning lines and data scanning lines.

Figure 2:
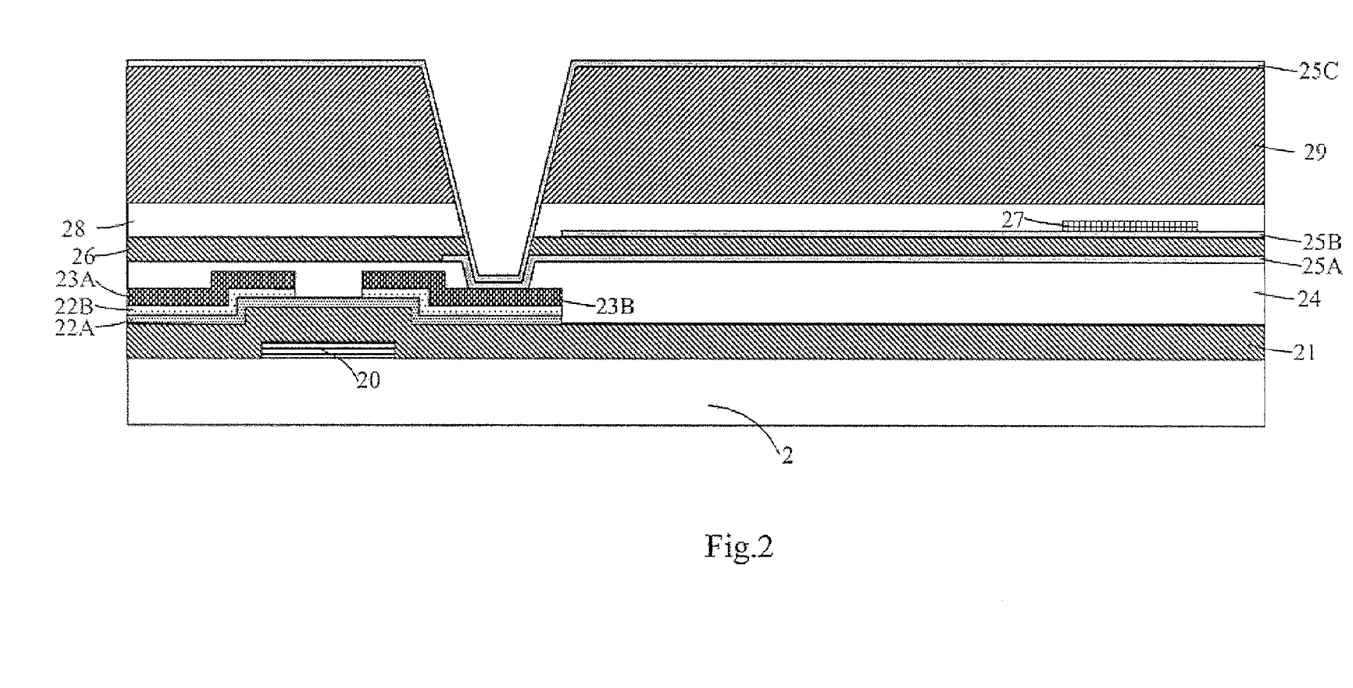
FIG. 2 is a structural view of one pixel unit of a traditional TFT flat sensors.

A traditional array substrate of TFT flat sensors has a structure as illustrated in FIG. 2. The X-ray sensor comprises from top to bottom: a substrate 2, a gate electrode 20 on the substrate 2, a gate insulating layer 21 on the gate electrode 20, an active layer 22A and an ohmic contact layer 22B on the gate insulating layer 21, a drain electrode 23A and a source electrode 23B that are on the ohmic contact layer 22B and in the same layer, a data scanning line (not shown) connected with the source electrode 23B, a passivation layer 24 on the drain electrode 23A and the source electrode 23B, a first ITO (indium tin oxide) layer 25A on the passivation layer 24, an insulating layer 26 on the first ITO layer 25A, a second ITO layer 25B on the insulating layer 26, a common electrode 7 on the second ITO layer 25B, a resin buffer layer 28 on the common electrode 27, a resin layer 29 on the resin buffer layer 28, and a third ITO layer 25C on the resin layer 29. The resin buffer layer 28 is used for bonding the bonding resin layer 29.

Traditional TFT flat sensors typically undergo 10 patterning processes during fabrication. Each pattern process generally comprises masking, exposing, developing, etching, stripping and so on. The number of patterning processes can be used as a measurement for simplicity of manufacturing TFT flat sensor. In the manufacturing of TFT flat sensor, the fewer the number of patterning processes is, the shorter the production time is, the higher the production efficiency is, and the lower the manufacturing cost become.

SUMMARY

Embodiments of the present disclosure provide a thin film transistor (TFT) flat sensor and manufacturing method therefore, which can shorten production cycle, reduce the production costs, and enhance the production efficiency.

An embodiment of the present disclosure provides a TFT flat sensor comprising a plurality of pixel units each comprising: a common electrode and a common electrode insulating layer on a substrate, wherein a first via hole is provided in the common electrode insulating layer at a location corresponding to the common electrode; a gate electrode on the common electrode insulating layer; a first conductive film layer on the common electrode and the gate electrode and acting as one polar plate of a storage capacitor, wherein the first conductive film layer contact the common electrode through the first via hole; a gate insulating layer, an active layer, a drain electrode and a source electrode, a second conductive film layer acting as another polar plate of the storage capacitor, a protection layer, and a third conductive film layer for collecting carriers on the first conductive film layer, wherein the second conductive film layer is between the source electrode and the active layer, a second via hole is provided in the protection layer at a location corresponding to the source electrode, and the third conductive film layer contacts the source electrode via the second via hole.

Another embodiment of the present disclosure provides a method for manufacturing the TFT flat sensor comprising: depositing a first metal film on a substrate and forming a common electrode on the substrate with one patterning process; successively depositing an insulating film and a second metal film on the substrate having the common electrode formed thereon, and forming a gate electrode by applying one patterning process to the second metal film; applying one patterning process to the deposited insulating film to form a common electrode insulating layer, wherein a first via hole is provided in the common electrode insulating layer at a location corresponding to the common electrode; depositing a transparent conductive film on the substrate having the common electrode, the common electrode insulating layer and the gate electrode formed thereon, and forming a first conductive film layer, acting as one polar plate of a storage capacitor, on the common electrode and the gate electrode with one patterning process.

Further another embodiment of the present disclosure provides a TFT flat sensing device comprising the above-mentioned TFT flat sensor.

Further scope of applicability of the present disclosure will become apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the following detailed description.

BRIEF DESCRIPTION OF THE DRAWINGS

The present disclosure will become more fully understood from the detailed description given hereinafter and the accompanying drawings which are given by way of illustration only, and thus are not limitative of the present disclosure and wherein.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," or "the" etc., are not intended to limit the amount, but indicate the existence of at lease one. The terms "includes," "including," "comprises," "comprising," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may comprise an electrical connection, directly or indirectly. "On," "under," "right," "left" and the like are only used to indicate relative position relationship, and when the position of the object which is described is changed, the relative position relationship may be changed accordingly.

According to an embodiment of the present disclosure, only nine patterning processes are used to complete the manufacturing of a TFT flat sensor, thereby shortening production cycle, reducing production costs and enhancing production efficiency.

The patterning process is for example a photolithography patterning process comprising: coating a photoresist layer on the structure layer to be patterned, exposing the photoresist layer with a mask plate, developing the exposed photoresist layer to get a photoresist pattern, etching the structure layer with the photoresist pattern, and then optionally removing the photoresist pattern. As required, the patterning process may also be screen printing, ink jet printing, 3D printing or the like.

Figure 3A:
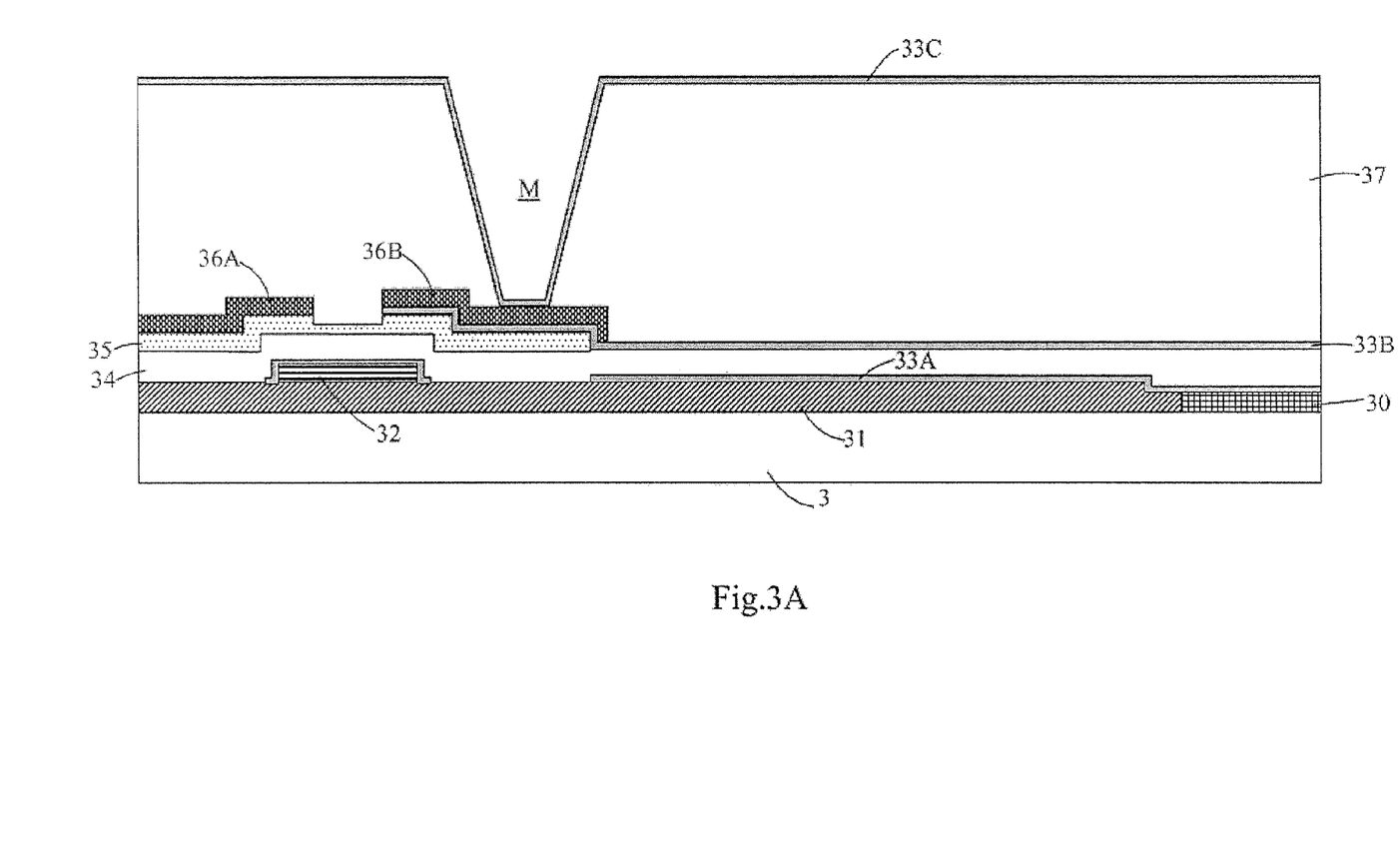
FIG. 3A is a structural view of one pixel unit of a TFT flat sensor according to an embodiment of the present embodiment.

As illustrated in FIG. 3A, the TFT flat sensor according to an embodiment of the present disclosure comprises a substrate 3 and a plurality of pixel units on the substrate 3, and each of the pixel units comprises: a common electrode 30 and a common electrode insulating layer 31 on the substrate 3; a gate electrode 32 on the common electrode insulating layer 31; a first conductive film layer 33A provided on the common electrode 30 and the gate electrode 32 and capable of being used as one polar plate of a storage capacitor; a gate insulating layer 34, an active layer 35, a drain electrode 36A and a source electrode 36B that are provided on the first conductive film layer 33A; a second conductive film layer 33B capable of being used as another polar plate of the storage capacitor; a protection layer 37 for protecting the above-mentioned various structures; and a third conductive film layer 33C on the protection layer 37 and for collecting carriers.

The common electrode insulating layer 31 is provided with a first via hole at a location corresponding to the common electrode 30 for exposing the common electrode 30, thereby enabling the first conductive film layer 33A to connect with the common electrode 30; the active layer 35 is located on the gate insulating layer 34 at a location corresponding to the gate electrode 32 and has a TFT channel included therein; the second conductive film layer 33B is provided between the source electrode 36B and the active layer 35; a second via hole M is formed in the protection layer 37 at a location corresponding to the source electrode 36B, through which the third conductive film layer 33C makes electrical contact with the source electrode 36B, enabling the third conductive film layer 33C to input the collected carriers to the source electrode 36B.

The light sensitive structure such as a photodiode in each of the pixel units can be formed on the third conductive film layer 33C; for example, the photodiode may cover the effective coverage in the entire pixel unit as much as possible. There is no rigid requirement on relative position between the TFT and the photodiode. The TFT is generally positioned around the intersection between the gate line and the data scanning line for the pixel unit, the photodiode fills the remaining region as much as possible; the photodiode may be connected with the source electrode or the drain electrode of the TFT. Please note that there is no rigid distinguishing between the source electrode and the drain electrode of the TFT, and the photodiode is connected with the opposite side electrode of the TFT data scanning line.

The common electrode 30 in the above embodiment of the present disclosure may use a single-layer of a metal material such as molybdenum, aluminum, tungsten, titanium and copper, or may use a single layer of an alloy material, or a multi-layer composite layer of metals such as molybdenum, aluminum, tungsten, titanium and copper; preferably, the common electrode 30 may have a thickness of about 100 nm~500 nm.

In order to mitigate influence of poor disconnection on electricity performance of the common electrode 30, for example, a net-like wiring is used in manufacturing the common electrode, that is, the common electrode is in net shape comprising intersecting electrode parts, for example, horizontal parts and longitudinal parts.

The material for the common electrode insulating layer 31 in the above embodiment of the present disclosure may be for example silicon nitride, silicon oxide or the like; for example, the common electrode insulating layer 31 may have a thickness of about 100 nm~1000 nm.

The gate electrode 32 in the above embodiment of the present disclosure may use a single-layer of a metal material such as molybdenum, aluminum, tungsten, titanium and copper, or may use a single layer of an alloy material, or a multi-layer composite layer of metals such as molybdenum, aluminum, tungsten, titanium and copper; for example, the gate electrode 32 may have a thickness of about 100 nm~500 nm.

The first part of the first conductive film layer 33A in the above embodiment of the present disclosure contacts the common electrode 30, and the second part contacts the gate electrode 32 but the first part and second part does not contact each other. During etching of the first conductive film layer 33A, the first conductive film layer 33A may also function to prevent the etching solution from etching the gate electrode 32 and the common electrode 30, that is, the first conductive film layer 33A may also function as an etching protection layer for the gate electrode 32 and the common electrode 30. Preferably, the first part of the first conductive film layer 33A is enwrapped on the external surface of the gate electrode 32. The first conductive film layer 33A is of a transparent conducting material that may be an oxide such as ITO (indium tin oxide) or IZO (indium zinc oxide); for example, the first conductive film layer 33A may have a thickness of about 20 nm~120 nm.

The material for the gate insulating layer 34 in the above embodiment of the present disclosure may be an insulating material such as silicon nitride, silicon oxide or the like; for example, the gate insulating layer 34 may have a thickness of about 200 nm~600 nm.

The material for the active layer 35 in the above embodiment of the present disclosure may be Indium Gallium Zinc Oxide (IGZO), ZnO or IZO; for example, the active layer may have a thickness of about 60 nm~400 nm.

The active layer 35 generally comprises an intrinsic amorphous silicon layer and a doped amorphous silicon layer (i.e., ohmic contact layer), for example, the intrinsic amorphous silicon layer may have a thickness of about 30 nm~300 nm, and the ohmic contact layer may have a thickness of about 30 nm~100 nm.

The second conductive film layer 33B in the above embodiment of the present disclosure is of a transparent conducting material, e.g., an oxide such as ITO or IZO. The second conductive film layer 33B may be made from a material identical to or different from that of the first conductive film layer 33A.

The drain electrode 36A in the above embodiment of the present disclosure may use a single-layer of a metal material such as molybdenum, aluminum, tungsten, titanium and copper, or may use a single layer of an alloy material such as an alloy of molybdenum and aluminum, and also a multi-layer composite layer of metals such as molybdenum, aluminum, tungsten, titanium and copper; for example, the drain electrode 36A may have a thickness of about 100 nm~500 nm.

The source electrode 36B may use a single-layer of a metal material such as molybdenum, aluminum, tungsten, titanium and copper, or may use a single layer of an alloy material, or a multi-layer composite layer of metals such as molybdenum, aluminum, tungsten, titanium and copper; for example, the source electrode 36B may have a thickness of about 100 nm~500 nm.

A data scanning lines (not shown) is connected with the formed source electrode 36B, for driving the corresponding pixel unit. The data scanning line may use a single-layer of a metal material such as molybdenum, aluminum, tungsten, titanium and copper, or use a single layer of an alloy material such as an alloy of molybdenum and aluminum, or a multi-layer composite layer of metals such as molybdenum, aluminum, tungsten, titanium and copper; for example, the data scanning line may have a thickness of about 100 nm~500 nm.

Figure 3B:
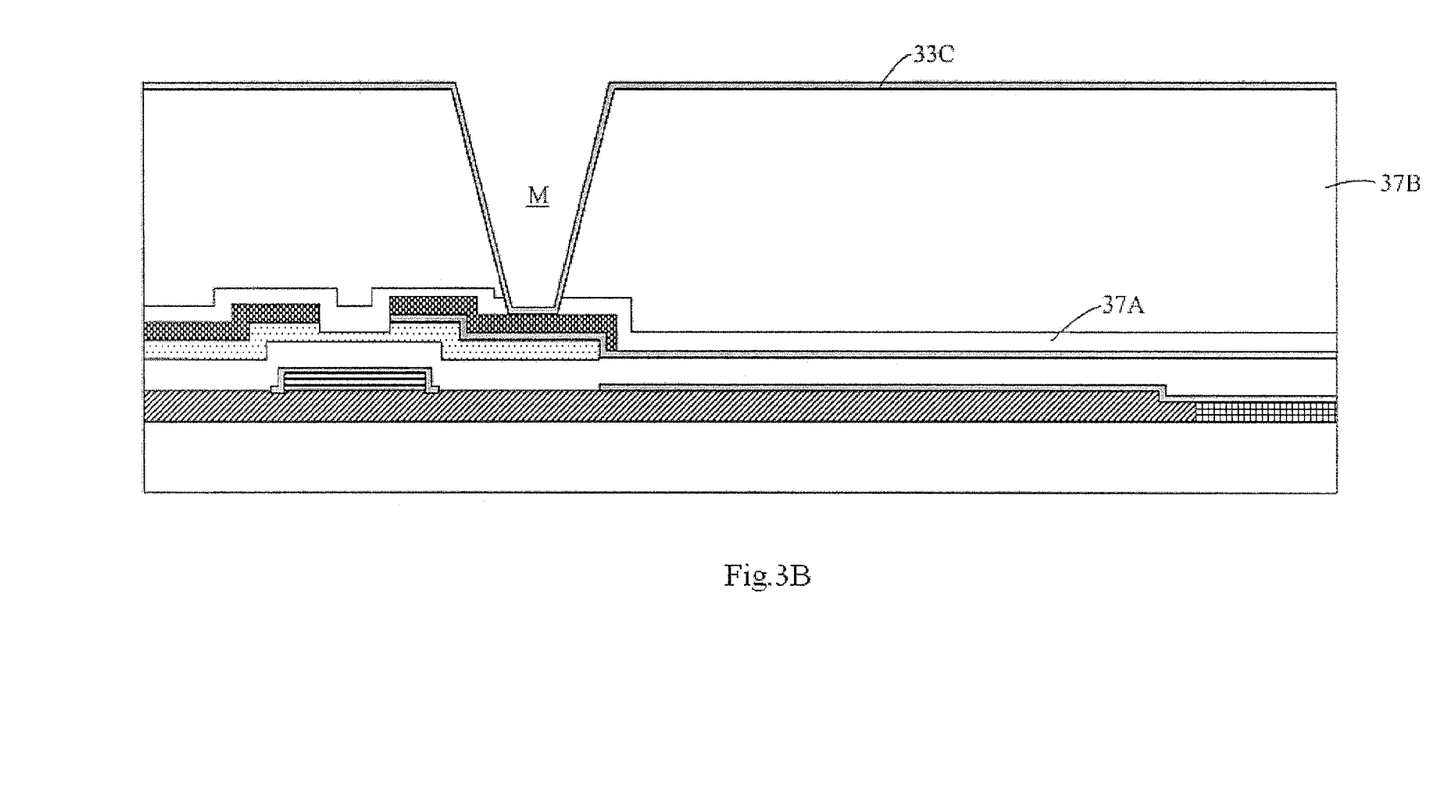
FIG. 3B is a structural view of a protection layer of a TFT flat sensor according to an embodiment of the present embodiment.

The protection layer 37 in the above embodiment of the present disclosure comprises a passivation layer 37A and a resin layer 37B, as illustrated in FIG. 3B. The passivation layer 37A mainly functions to protect various structures on the TFT flat sensor and bond the resin layer 37B. The resin layer 37B mainly functions to enlarge the distance between the above-mentioned various structures on the TFT flat sensor and the third conductive film layer 33C to reduce occurrence of crosstalk.

The material for the passivation layer 37A may be silicon nitride or silicon oxide; for example, the passivation layer 37A may have a thickness of about 150 nm~2500 nm. The material for the resin layer 37B may be photosensitive or non-photosensitive material and the resin layer 37B has a thickness of about 1 μm to 4 μm.

A second via hole M is formed in the passivation layer 37A and the resin layer 37B at the location corresponding to the source electrode 36B, through which the third conductive film layer 33C contacts the source electrode 36B, allowing the third conductive film layer 33C to input the collected carriers to the source electrode 36B.

The third conductive film layer 33C in the above embodiment of the present disclosure is of a transparent conducting material that may be an oxide such as ITO or IZO; for example, the third conductive film layer 33C may have a thickness of about 20 nm~120 nm.

It is noted that, the third conductive film layer 33C may be formed of a material identical to that of the first conductive film layer 33A (and/or the second conductive film layer 33B), and may also be formed of a material different from that of both the first and second conductive film layers 33A and 33B.

The method for manufacturing the TFT flat sensor according to an embodiment of the present disclosure comprises the following steps.

Step 401, depositing a metal film on a substrate and forming a common electrode on the substrate with one patterning process.

In order to mitigate influence of poor disconnection on electricity performance of the common electrode, for example, a net-like wiring is used for manufacturing the common electrode. The common electrode may use a single-layer of a metal material such as molybdenum, aluminum, tungsten, titanium and copper, or may use a single layer of an alloy material, or a multi-layer composite layer of metals such as molybdenum, aluminum, tungsten, titanium and copper; for example, the common electrode may have a thickness of about 100 nm~500 nm.

Step 402, successively depositing an insulating film and a metal film on the substrate with the common electrode formed thereon, and forming a gate electrode by applying one patterning process to the metal film.

The gate electrode may use a single-layer of a metal material such as molybdenum, aluminum, tungsten, titanium and copper, or may use a single layer of an alloy material, or a multi-layer composite layer of metals such as molybdenum, aluminum, tungsten, titanium and copper; for example, the gate electrode may have a thickness of about 100 nm~500 nm.

Step 403, applying one patterning process to the insulating film to form the common electrode insulating layer, wherein a first via hole is formed in the common electrode insulating layer at a location corresponding to the common electrode.

The via hole is provided in the common electrode insulating layer at a location corresponding to the common electrode to expose the common electrode, allowing the first conductive film layer to be connected with the common electrode. The material for the common electrode insulating layer may be for example silicon nitride, silicon oxide or the like; for example, the common electrode insulating layer may have a thickness of about 100 nm~1000 nm.

Step 404, depositing a transparent conductive film on the substrate having the common electrode, the common electrode insulating layer and the gate electrode formed thereon, and forming a first conductive film layer, acting as one polar plate of a storage capacitor, on the common electrode and the gate electrode with one patterning process.

The first part of the first conductive film layer that contacts the common electrode does not contact the second part that contacts the gate electrode; during etching of the first conductive film layer, the first conductive film layer can also function to prevent the etching solution from etching the gate electrode and the common electrode, that is, the first conductive film layer can also function as an etching protection layer for the gate electrode and the common electrode. For example, the second part of the first conductive film layer is enwrapped on the external surface of the gate electrode 32.

The first conductive film layer is of a transparent conducting material that may be an oxide such as ITO or IZO; for example, the first conductive film layer may have a thickness of about 20 nm~120 nm.

Furthermore, the method according to an embodiment of the present disclosure may further comprise the following step 405.

Step 405, successively forming a gate insulating layer, an active layer, a second conductive film layer acting as another polar plate of the storage capacitor, a drain electrode and a source electrode, a protection layer, and a third conductive film layer for collecting carriers on the substrate having the first conductive film layer formed thereon.

The second conductive film layer is provided between the active layer and the source electrode. A second via hole is formed in the protection layer at a location corresponding to the source electrode, allowing the conductive film layer contact the source electrode through the via hole and input collected carriers to the source electrode.

The material for the gate insulating layer may be an insulating material such as silicon nitride, silicon oxide or the like; for example, the gate insulating layer may have a thickness of about 200 nm~600 nm. The material for the active layer may be Indium Gallium Zinc Oxide (IGZO), ZnO or IZO; for example, the active layer may have a thickness of about 60 nm~400 nm.

The second conductive film layer is of a transparent conducting material, e.g., an oxide such as ITO or IZO. The drain electrode may use a single-layer of a metal material such as molybdenum, aluminum, tungsten, titanium and copper, or may use a single layer of an alloy material such as an alloy of molybdenum and aluminum, or a multi-layer composite layer of metals such as molybdenum, aluminum, tungsten, titanium and copper; for example, the drain electrode 36A may have a thickness of about 100 nm~500 nm. The source electrode may use a single-layer of a metal material such as molybdenum, aluminum, tungsten, titanium and copper, or may use a single layer of an alloy material, or a multi-layer composite layer of metals such as molybdenum, aluminum, tungsten, titanium and copper; for example, the source electrode may have a thickness of about 100 nm~500 nm. A data scanning line (not shown) is connected with the formed source electrode for driving the pixel unit. The data scanning line may use a single-layer of a metal material such as molybdenum, aluminum, tungsten, titanium and copper, or may use a single layer of an alloy material such as an alloy of molybdenum and aluminum, or a multi-layer composite layer of metals such as molybdenum, aluminum, tungsten, titanium and copper; for example, the data scanning line may have a thickness of about 100 nm~500 nm.

The protection layer may comprise a passivation layer and a resin layer. The passivation layer mainly functions to protect various structures on the TFT flat sensor and bond the resin layer. The resin layer mainly functions to enlarge the distance between the above-mentioned various structures on the TFT flat sensor and the third conductive film layer to reduce occurrence of crosstalk. The material for the passivation layer may be silicon nitride or silicon oxide; for example, the passivation layer may have a thickness of about 150 nm~2500 nm. The material for the resin layer may be photosensitive or non-photosensitive material and the resin layer has a thickness of 1 μm to 4 μm.

The third conductive film layer is of a transparent conducting material that may be an oxide such as ITO or IZO; for example, the third conductive film layer may have a thickness of about 20 nm~120 nm.

The manufacturing method for the TFT flat sensor according to an embodiment of the present disclosure will be described in detail herein below with the structure illustrated in FIG. 3B as an example.

One example of the method for manufacturing the TFT flat sensor according to the present disclosure comprises the following steps 501~509.

Figure 4A:
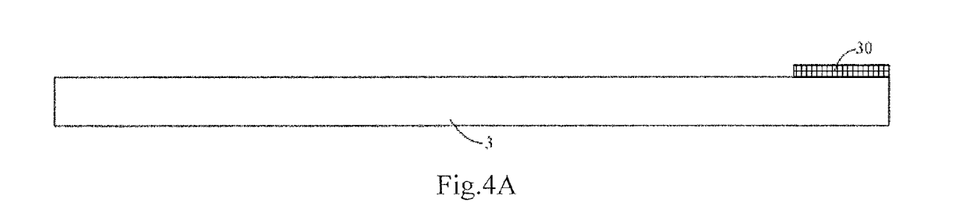
FIGS. 4A~4I is a sectional structural diagram during manufacturing a TFT flat sensor according to an embodiment of the present disclosure.

Step 501, depositing a metal film on the substrate 3 and forming a common electrode 30 on the substrate 3 with one patterning process, as illustrated in FIG. 4A.

Figure 4B:
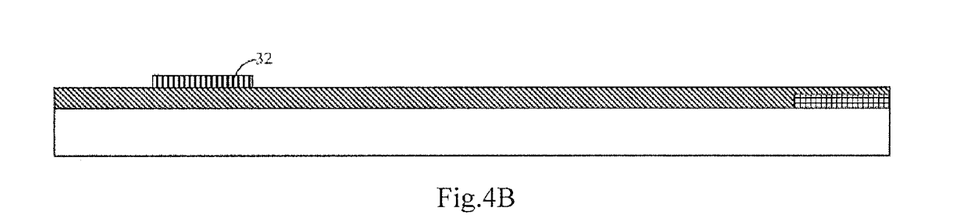

Step 502, successively depositing an insulating film and a metal film on the substrate 3 with the common electrode 30 formed thereon, and forming a gate electrode 32 by applying one patterning process to the metal film, as illustrated in FIG. 4B.

Figure 4C:
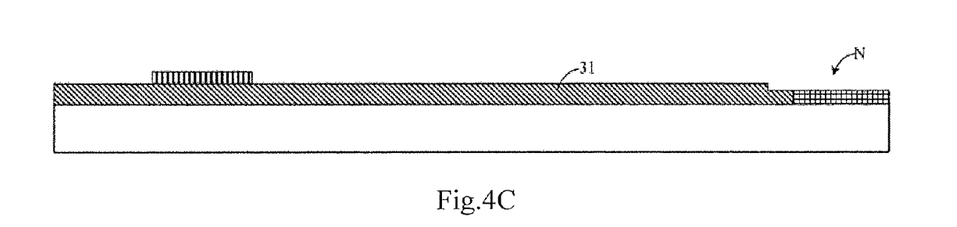

Step 503, applying one patterning process to the deposited insulating film to form the common electrode insulating layer 31, wherein a first via hole N is formed in the common electrode insulating layer 31 at a location corresponding to the common electrode 30 to expose the common electrode 30, as illustrated in FIG. 4C.

Figure 4D:
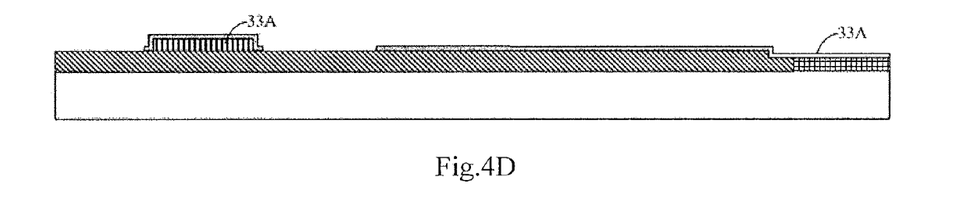

Step 504, depositing a transparent conductive film on the substrate 3 having the common electrode 30, the common electrode insulating layer 31 and the gate electrode 32 formed thereon, and forming a first conductive film layer 33A acting as one polar plate of a storage capacitor with one patterning process, wherein the first part of the first conductive film layer 33A that contacts the common electrode 30 does not connect with the second part that contacts the gate electrode 32, as illustrated in FIG. 4D.

During etching of the first conductive film layer 33A, the first conductive film layer 33A can also function to prevent the etching solution from etching the gate electrode 32 and the common electrode 30, that is, the first conductive film layer 33A may also act as an etching protection layer for the gate electrode 32 and the common electrode 30.

For example, the first part of the first conductive film layer 33A is enwrapped on the external surface of the gate electrode 32.

Figure 4E:
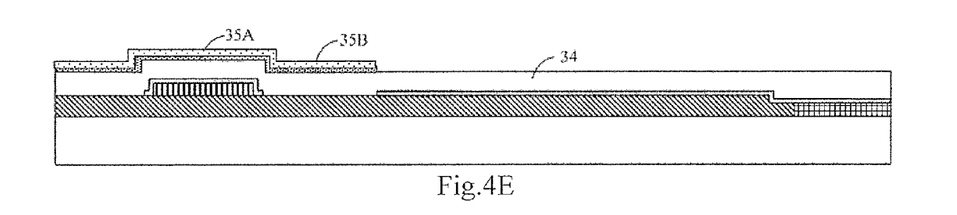

Step 505, depositing an insulation film and an active layer film on the substrate 3 having a first conductive film layer 33A formed thereon, and forming a gate insulating layer 34 and an active layer with one patterning process, wherein the active layer is located on the gate insulating layer 34 at a location corresponding to the gate electrode 32, the active layer comprises an intrinsic amorphous silicon layer 35A and a doped amorphous silicon layer 35B (i.e., the ohmic contact layer), as illustrated in FIG. 4E.

Furthermore, a gate insulating layer film, an active layer film and an ohmic contact layer film are successively deposited on the substrate 3 formed in step 504, and an intrinsic amorphous silicon layer 35A and an ohmic contact layer 35B are formed with one patterning process; the gate insulating layer 34 is configured to prevent the first conductive film layer 33A from contacting the active layer.

The deposition in this step comprises, but not limited to, amorphous deposition or polycrystalline deposition. The forming methods for various layers in the manufacturing process of the array substrate comprise a plurality of methods, such as sputtering, depositing or the like. For example, chemical vapor deposition (CVD), plasma enhanced chemical vapor deposition (PECVD) may be applied. The deposited films are amorphous or polycrystalline deposited films. As to application of which specific deposition for which layer, examples will be omitted.

Preferably, the ohmic contact layer at the pre-provided TFT channel location is etched when forming a pattern of the active layer to expose the intrinsic amorphous silicon layer, thereby forming the TFT channel which provides a conduction path when the TFT is turned on.

Figure 4F:
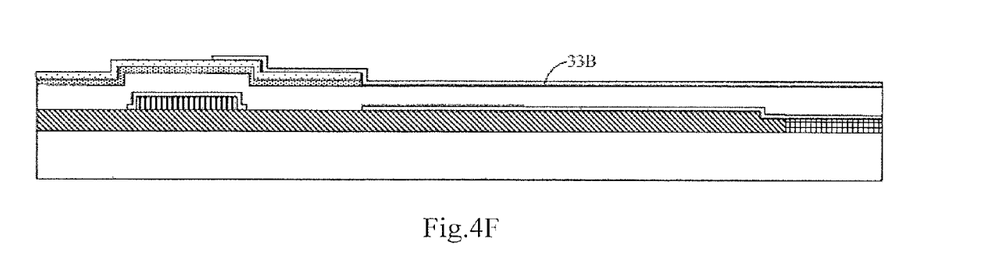

Step 506, depositing a transparent conductive film on the substrate 3 having the active layer formed thereon, and forming a second conductive film layer 33B with one patterning process, as illustrated in FIG. 4F, wherein the second conductive film layer 33B covers over the active layer at the location corresponding to the source electrode and acts as another polar plate of the storage capacitor.

Figure 4G:
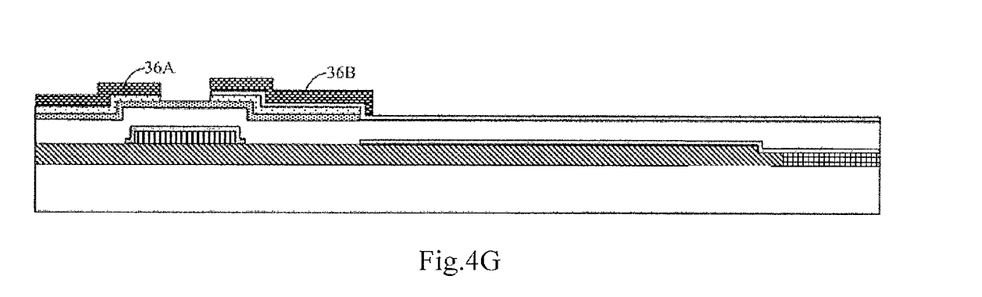

Step 507, depositing a metal film on the substrate 3 having the second conductive film layer 33B formed thereon, and forming a drain electrode 36A, a source electrode 36B and a data scanning line (not shown) on the active layer with one patterning process, as illustrated in FIG. 4G, wherein the data scanning line is connected with the source electrode 36B.

It is to be noted that, if in step 505 no TFT channel is formed, then the ohmic contact layer at the pre-provided TFT channel location is etched while forming the drain electrode 36A and the source electrode 36B in this step, to expose the intrinsic amorphous silicon layer, thereby forming the TFT channel.

Figure 4H:
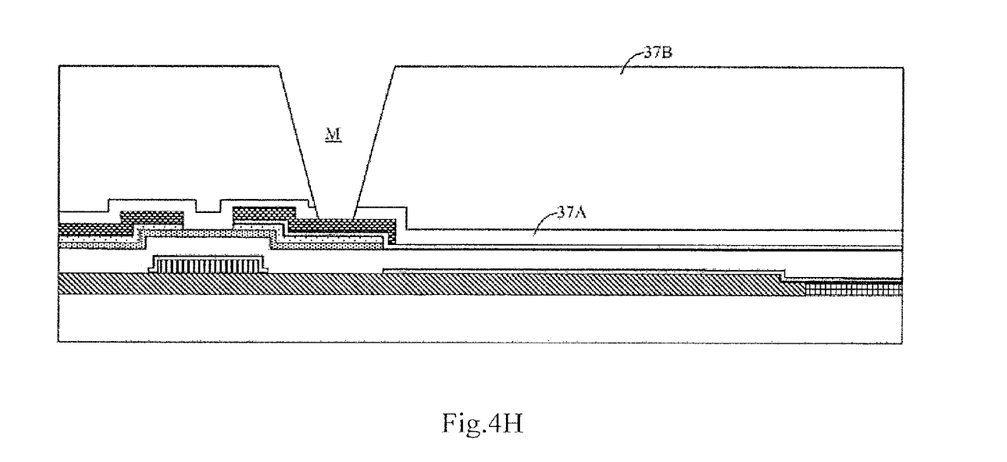

Step 508, depositing a protection layer film on the substrate having the drain electrode 36A, the source electrode 36B and the data scanning lines formed thereon and forming a protection layer with one patterning process, as illustrated in FIG. 4H, wherein the protection layer comprises a passivation layer 37A and a resin layer 37B.

The passivation layer 37A mainly functions to protect various structures on the TFT flat sensor and bond the resin layer 37B. The resin layer 37B mainly functions to enlarge the distance between the above-mentioned various structures on the TFT flat sensor and the third conductive film layer 33C to reduce occurrence of crosstalk.

In this step, a second via hole M is formed in the passivation layer 37A and the resin layer 37B at a location corresponding to the source electrode, through which the third conductive film layer 33C contacts the source electrode 36B, allowing the third conductive film layer 33C to input the collected carriers to the source electrode 36B.

Figure 4I:
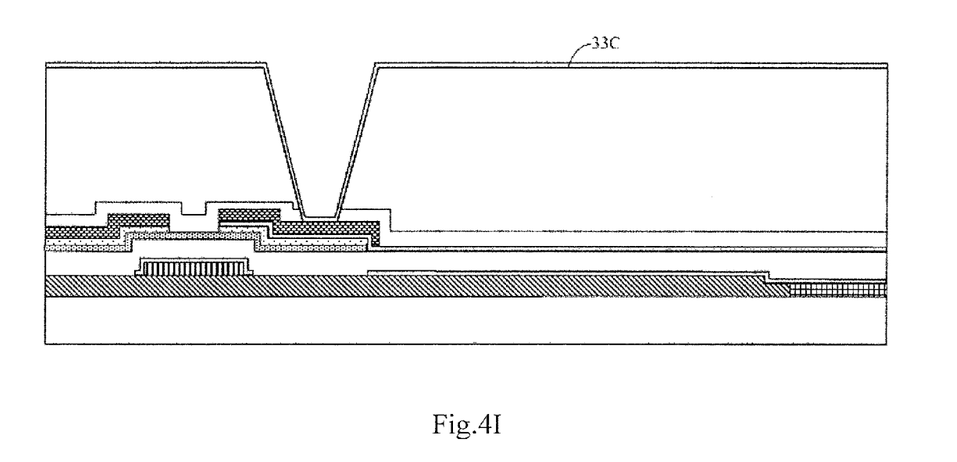

Step 509, depositing a transparent conductive film on the substrate having the resin layer 37B formed thereon, and forming a third conductive film layer 33C with one patterning process, as illustrated in FIG. 4I.

Traditional TFT flat sensors need 10 patterning processes, which results in high manufacturing cost and complex manufacturing process, and due to the too many manufacturing processes, yield will go downwards, and production capacity of the equipments will fall. In contrast, nine patterning processes are used in the method according to the above-mentioned embodiments to manufacture a TFT flat sensor, which simplifying the manufacturing process, thereby reducing the manufacturing cost and enhancing the yield of the manufacturing.

Figure 5:
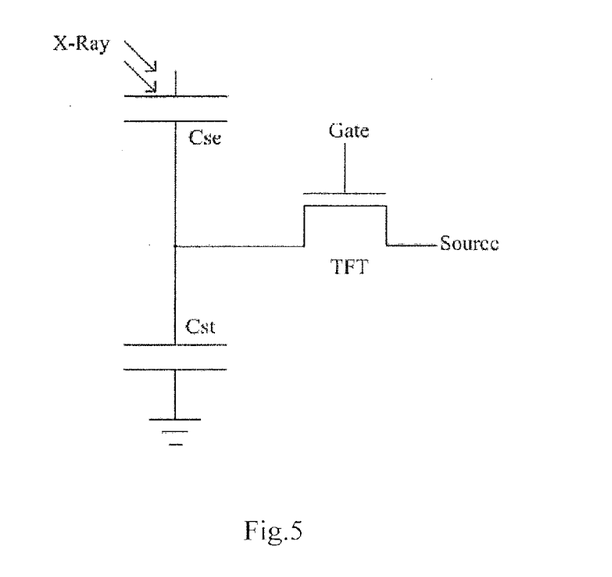
FIG. 5 is an equivalent circuit diagram of a pixel unit of a TFT flat sensor according to an embodiment of the present disclosure.

FIG. 5 shows an equivalent circuit diagram of a pixel unit of the TFT flat sensor according to an embodiment of the present disclosure. Cse represents the equivalent circuit of the photodiode for sensing the optoelectronic signals generated by incident X-ray, TFT represents the switching element, and Cst represents the equivalent circuit of the storage capacitor formed by the first conductive film layer and the second conductive film layer. The TFT's gate electrode is connected with the gate scanning line of the pixel unit, and the TFT's source electrode is connected with the pixel unit's data scanning line.

The array substrate of the TFT flat sensor according to an embodiment of the present disclosure comprises a plurality of gate scanning lines and data scanning lines intersecting each other and a plurality of above-mentioned pixel units defined by the gate scanning lines and the data scanning lines. In addition to the above-mentioned structure with the TFT, each pixel unit comprises a photodiode as a sensing element.

In addition, the embodiments of the present disclosure adopts a bottom common electrode structure, which increases the distance between the layer where the common electrode is located and the layer where the data scanning line is located, thus it is possible to effectively reduce the crosstalk due to the data scanning line, enhancing the service performance of the TFT flat sensor.

An embodiment of the present disclosure further provides a TFT flat sensing device comprising any of the above-mentioned TFT flat sensors, and this TFT flat sensing device may further comprise components such as a signal processing circuit and a display device.

The TFT flat sensors according to embodiments of the present disclosure are for example TFT flat X-ray sensors, and therefore the TFT flat sensing devices according to the embodiments of the disclosure may be TFT flat X-ray sensing devices.

The embodiment of the disclosure being thus described, it will be obvious that the same may be varied in many ways. Such variations are not to be regarded as a departure from the spirit and scope of the disclosure, and all such modifications as would be obvious to those skilled in the art are intended to be comprised within the scope of the following claims.

What is claimed is:

1. A thin film transistor (TFT) flat sensor comprising a plurality of pixel units each comprising:
    a common electrode and a common electrode insulating layer on a substrate, wherein a first via hole is formed in the common electrode insulating layer at a location corresponding to the common electrode;
    a gate electrode on the common electrode insulating layer;
    a first conductive film layer on the common electrode and the gate electrode and acting as one polar plate of a storage capacitor, wherein the first conductive film layer contact the common electrode through the first via hole;
    a gate insulating layer, an active layer, a drain electrode and a source electrode, a second conductive film layer acting as another polar plate of the storage capacitor, a protection layer, and a third conductive film layer for collecting carriers on the first conductive film layer, wherein the second conductive film layer is between the source electrode and the active layer, a second via hole is formed in the protection layer at a location corresponding to the source electrode, and the third conductive film layer contacts the source electrode via the second via hole.

2. The TFT flat sensor of claim 1, wherein a first part of the first conductive film layer that contacts the common electrode does not contact a second part of the first conductive film layer that contacts the gate electrode, and the first part is enwrapped on an external surface of the gate electrode.

3. The TFT flat sensor of claim 1, wherein the protection layer comprises a passivation layer and a resin layer located between the passivation layer and the third conductive film layer;
    wherein the second via hole is formed in the passivation layer and the resin layer at a location corresponding to the source electrode.

4. The TFT flat sensor of claim 1, wherein the first conductive film layer, the second conductive film layer and the third conductive film layer are each of a transparent conducting material.

5. The TFT flat sensor of claim 4, wherein the transparent conducting material is ITO or IZO.

6. A thin film transistor (TFT) flat sensing device comprising a TFT flat sensor according to claim 1.

\* \* \* \* \*